United States Patent
Mukherjee

(10) Patent No.: US 9,531,372 B1
(45) Date of Patent: Dec. 27, 2016

(54) DRIVER WITH TRANSFORMER FEEDBACK

(71) Applicant: TEXAS INSTRUMENTS INCORPORATED, Dallas, TX (US)

(72) Inventor: Tonmoy Shankar Mukherjee, Thousand Oaks, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/876,175

(22) Filed: Oct. 6, 2015

Related U.S. Application Data

(60) Provisional application No. 62/171,486, filed on Jun. 5, 2015.

(51) Int. Cl.
*H03K 3/00* (2006.01)
*H03K 17/567* (2006.01)

(52) U.S. Cl.
CPC .................... *H03K 17/567* (2013.01)

(58) Field of Classification Search
USPC ............... 327/109–110, 50–52, 139, 190
See application file for complete search history.

(56) References Cited

U.S. PATENT DOCUMENTS

| | | | |
|---|---|---|---|
| 5,121,284 A | 6/1992 | Onodera et al. | |
| 7,786,751 B2 | 8/2010 | Chujo et al. | |
| 7,886,239 B2 * | 2/2011 | Chang | H03K 3/012 327/110 |
| 7,902,900 B2 * | 3/2011 | Liu | H03F 3/08 327/109 |
| 9,048,018 B2 * | 6/2015 | Shirinfar | H01F 27/28 |
| 2015/0055431 A1 | 2/2015 | Lin | |

FOREIGN PATENT DOCUMENTS

| | | |
|---|---|---|
| CN | 103166628 A | 6/2013 |
| GB | 2396760 A | 6/2004 |

OTHER PUBLICATIONS

PCT Search Report for Application No. PCT/US 2016/036028, dated Oct. 6, 2016.

* cited by examiner

*Primary Examiner* — An Luu
(74) *Attorney, Agent, or Firm* — Andrew Viger; Frank D. Cimino

(57) ABSTRACT

A driver circuit includes an input drive stage, an output drive stage, and a transformer. The input drive stage is configured to receive a differential input signal, and amplify the differential input signal. The output drive stage is coupled to the input drive stage, and is configured to receive amplified differential input signal from the input drive stage, and to further amplify the amplified differential input signal. The transformer is configured to transfer current from the output drive stage to the input drive stage.

20 Claims, 3 Drawing Sheets

_US 9,531,372 B1_

DRIVER WITH TRANSFORMER FEEDBACK

CROSS-REFERENCE TO RELATED APPLICATIONS

The present application claims priority to U.S. Provisional Patent Application No. 62/171,486, filed Jun. 5, 2015, titled "High-Speed Driver Transformer Based Feed-Back," which is hereby incorporated herein by reference in its entirety.

BACKGROUND

High-speed digital communication relies on driver circuitry to convey digital signals between circuit board components, through cables, or in other wireline applications to provide signals for processing by receiver circuits. Differential drivers typically have either current mode or voltage mode output stages, and may be used for driving signals in a typical 50 ohm wireline or in other applications. Current mode drivers typically include a pair of transistors connected between a power supply and a current source, with the transistor gates receiving a differential input signal and the collectors driving a differential current output that can be converted to a voltage by a passive or active network, such as a simple resistor for many wireline applications. Although current mode drivers typically have good harmonic response and line impedance matching, these circuits generally suffer from high power consumption. Voltage mode drivers can be constructed as a simple emitter follower configuration, and offer reduced power consumption compared with current mode drivers, but may have poorer harmonic response and line impedance matching. As data rates continue to increase, further improvements are needed for wireline differential signal drivers.

SUMMARY

A driver circuit that includes feedback via a transformer is disclosed herein. In one implementation, a driver circuit includes an input drive stage, an output drive stage, and a transformer. The input drive stage is configured to receive a differential input signal, and amplify the differential input signal. The output drive stage is coupled to the input drive stage, and is configured to receive amplified differential input signal from the input drive stage, and to further amplify the amplified differential input signal. The transformer is configured to transfer current from the output drive stage to the input drive stage.

In another implementation a driver circuit includes transistors connected as a differential amplifier to receive a differential input signal, transistors connected to the differential amplifier as emitter followers; and a transformer configured to transfer current from collector terminals of the emitter followers to the differential amplifier. A first coil of the transformer is connected to a collector terminal of each of the emitter followers, and a second coil of the transformer is coupled to a collector terminal of each of the transistors of the differential amplifier.

In a further implementation, a driver circuit includes a differential predriver and a driver. The differential predriver includes transistors connected as a differential amplifier. The driver includes transistors connected to the differential predriver as emitter followers and driver circuit output terminals. A base terminal of each of the emitter followers is connected to a collector terminal of each of the transistors of the differential amplifier. The driver circuit output terminals are connected to emitter terminals of the emitter followers. A transformer is connected to the differential predriver and the driver to provide positive feedback current from the driver to the predriver. A first coil of the transformer is connected to a collector terminal of each of the emitter followers, and a second coil of the transformer is coupled to a collector terminal of each of the transistors of the differential amplifier. Each of the first coil and second coil of the transformer includes a center tap for connection of a power source to the predriver and the driver.

BRIEF DESCRIPTION OF THE DRAWINGS

For a detailed description of various examples, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . "

The term "couple" or "couples" is intended to mean either an indirect or direct electrical connection. Thus, if a first device couples to a second device, that connection may be through a direct electrical connection, or through an indirect electrical connection via other devices and connections.

The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Driver circuits are employed in a variety of electronic systems to convey signals from one location to another. For example, a driver circuit may be included on an integrated circuit to amplify or otherwise provide current and/or voltage sufficient to transfer a signal to a receiver circuit disposed internal or external to the integrated circuit. Driver circuits often consume a significant portion of the current consumed by an integrated circuit. Consequently, techniques for reducing driver energy consumption while maintaining signal integrity are desirable.

The driver circuit disclosed herein reduces overall energy consumption while maintaining or improving drive characteristics relative to conventional driver implementations. Embodiments of the driver circuit apply positive feedback through a transformer that couples input and output stages of the driver circuit. The positive feedback induces current flow in the input stage responsive to current flow in the output stage. As a result, embodiments of the driver may reduce energy consumption significantly (e.g., by up to 40%) relative to conventional drivers while providing equivalent or improved performance.

Figure 1:
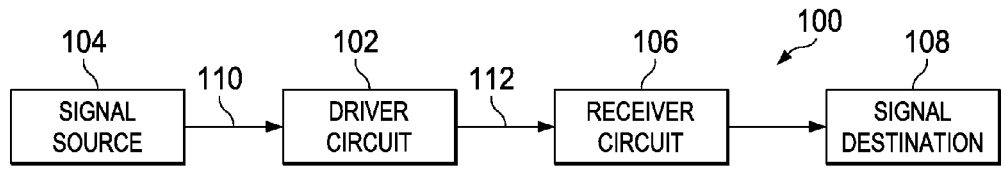
FIG. 1 shows a block diagram of signal transfer components in a circuit in accordance with various embodiments.

FIG. 1 shows a block diagram of a system 100 that includes signal transfer components in accordance with various embodiments. The system 100 includes a signal source 104, a driver circuit 102, a receiver circuit 106, and a signal destination 108. In some embodiments, the driver circuit 102 may be included in the signal source 104 and/or the receiver circuit 106 may be included in the signal destination 108. The signal source 104 may be any circuit that generates a signal 110. For example, the signal source 104 may be a clock generator that produces a clock signal to be applied by the signal destination 108, or may be a data source the produces data to be applied by the signal destination 108. The signal 110 may be a differential signal, where a differential signal includes a pair of signals, where each of the signals is an inversion of the other signal.

The driver circuit 102 receives the signal 110 and conditions the signal 110 for transmission to the receiver circuit 106 as signal 112. The signal 112 may also be a differential signal. The conditioning applied by the driver circuit 102 may include amplification of voltage and/or current, impedance matching, etc. The driver circuit 102 includes transformer coupled positive feedback that advantageously reduces energy consumption relative to conventional drivers that offer equivalent performance.

The receiver circuit 106 detects the signal 112 transmitted by the driver circuit 102, conditions the received signal 112, and provides the received signal to the signal destination 108. The receiver circuit 106 may be arranged to detect differential signals and convert the differential signals to single-ended signals in some embodiments. The driver circuit 102 and the receiver circuit 106 may be formed on a same integrated circuit, or on different integrated circuits or in discrete circuits.

Figure 2:
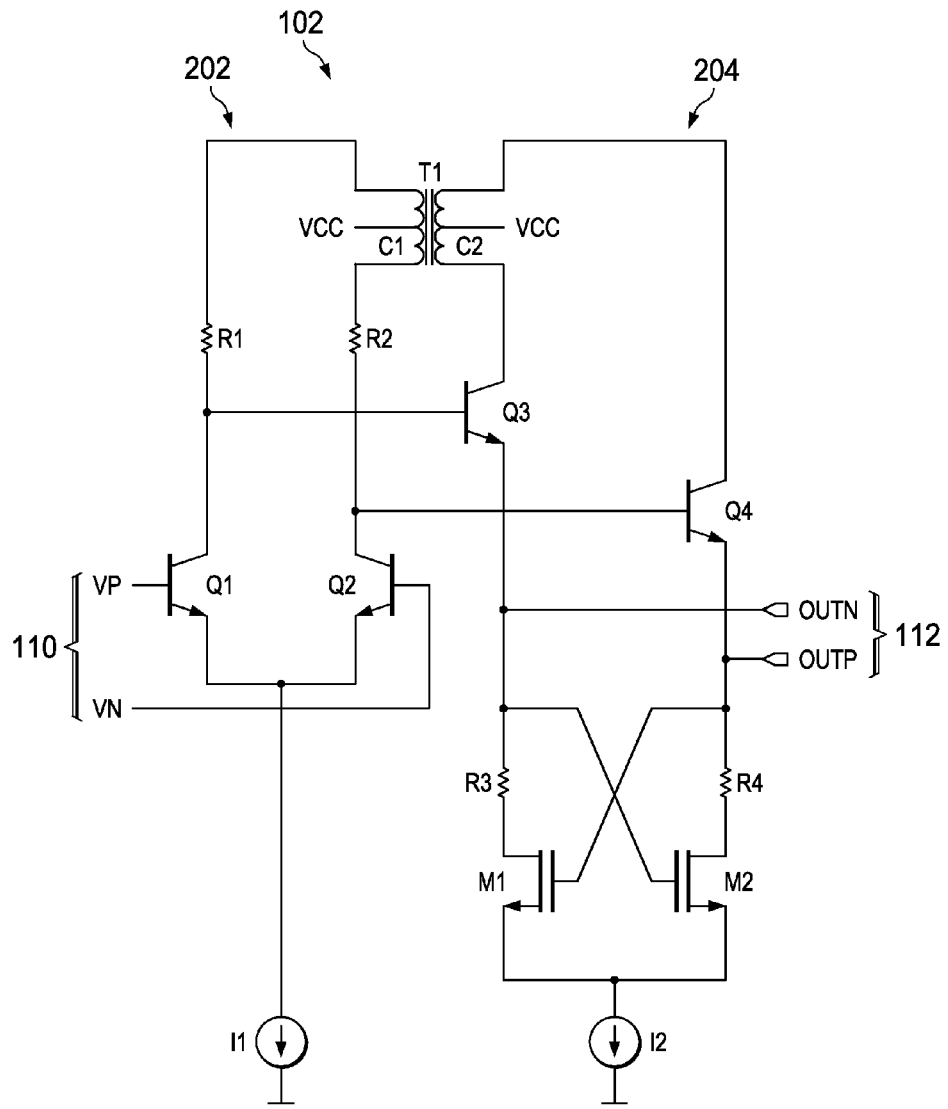
FIG. 2 shows a schematic diagram of a driver circuit in accordance with various embodiments.

FIG. 2 shows a schematic diagram of the driver circuit 102 in accordance with various embodiments. The driver circuit 102 includes an input drive stage 202 and an output drive stage 204. The input drive stage 202 drives the output drive stage 204. The input drive stage 202 and the output drive stage 204 may also be respectively referred to as a predriver and a driver. The input drive stage 202 includes transistors Q1 and Q2, resistors R1 and R2, and current source 11. The transistors Q1 and Q2 are connected and arranged to form a differential amplifier. The two phases of the differential input signal 110 drive the base terminals of the transistors Q1 and Q2. The emitter terminals of the transistors Q1 and Q2 are coupled to the current source 11. The current flow through the current source 11, and the transistors Q1 and Q2, may be termed I_PRE_DRV.

Output of the input drive stage 202 is taken from the collectors of the transistors Q1 and Q2 and applied to the output drive stage 204. The output drive stage 204 includes transistors Q3 and Q4, resistors R3 and R4, field effect transistors (FETs) M1 and M2, and current source 12. The output of the transistors Q1 and Q2 is applied to the bases of transistors Q3 and Q4 as input to the output drive stage 204. The transistors Q3 and Q4 are arranged and connected as emitter followers. Output terminals OUTN and OUTP of the driver circuit 102 are provided at the emitters of the transistors Q3 and Q4. The transistors Q1, Q2, Q3, and Q4 may be NPN bipolar junction transistors.

The FETs M1 and M2 are coupled to the emitters of the transistors Q3 and Q4. More specifically, the drain terminals of the FETs M1 and M2 are respectively coupled to the emitters of the transistors Q3 and Q4 via resistors R3 and R4. The resistors R3 and R4 provide impedance matching for a load impedance (e.g., input impedance of the receiver circuit 106) driven by the driver circuit 102. The gate terminals of the FETs M1 and M2 are respectively connected to and driven by the emitters of the transistors Q4 and Q3. The FETs M1 and M2 may by N-channel FETs.

The source terminals of the FETs M1 and M2 are coupled to the current source 12. The current flow through the current source 12, the transistors Q3 and Q4, and the FETs M1 and M2 may be termed I_DRV.

The output drive stage 204 is also coupled to the input drive stage 202 via the transformer T1. The transformer T1 includes windings or coils C1 and C2. The coil C1 may be the primary coil of the transformer T1, and the coil C2 may be the secondary coil of the transformer T1. Coil C2 electrically connects the collector terminals of the transistors Q3 and Q4 in the output drive stage 204. Coil C1 electrically connects the resistors R1 and R2 in the input drive stage 202. Each of the coils C1 and C2 includes a center tap that is connected to a power supply voltage (e.g., Vcc) that powers the input drive stage 202 and the output drive stage 204. Various parameters of the transformer T1 may be selected based on the particular parameters of the driver circuit 102. For example, if the current in the output drive stage 204 is substantially higher that the current in the input stage 202, then the number of turns in coil C1 may be reduced relative to the number of turns in coil C2. Conversely, if the current in the output stage 204 is not high relative to the current in the input stage 202, the number of turns in coil C1 may be increased.

In some implementations (e.g., line drive implementations), the current flowing in the output drive stage 204 (i.e., I_drv) may be 4-5 time greater than the current flowing in the input drive stage 202 (i.e., I_pre_drv) because the output drive stage 204 needs to drive a greater load (e.g., a 50 ohm load). The driver circuit 102 employs the relatively large current flowing in the output drive stage 204 to provide feedback to the input drive stage 202 via the transformer T1. Activation of either of the transistors Q3 and Q4, via signal received from Q1 or Q2 of the input drive stage 202, causes current to flow in the coil C2. The current flowing in coil C2 induces a corresponding current flow in the coil C1. That is, activation of the transistors Q3 or Q4 creates positive feedback in the input drive stage 202 via the transformer T1. The positive feedback speeds up the operation of the input drive stage 202. The current fed-back to the input drive stage 202 via the transformer compensates for parasitic capacitance in the input drive stage 202, and does not load the output of the driver circuit 102.

The driver circuit 102 includes no feed-forward path between the input drive stage 202 and the output drive stage 204. The feed-forward path through the transformer T1 from the input drive stage 202 is broken by the collectors of the emitter follower transistors Q3 and Q4. Because the feed forward path is broken, the input drive stage sees only the effects of the coil C1 and no additional loading is transferred.

Looking into the coil C1, the input drive stage 202 sees a current of:

$$I\_pre\_drv + I\_drv * k$$

where:
k is the turns ratio of the transformer T1.
Since $$I\_drv = M * I\_pre\_drv$$

where M is, for example, 4 to 6. The effective current in the coil C1 is:

$$I\_pre\_drv * (M*k+1)$$

Accordingly, in embodiments of the driver circuit 102, the size of the coil C1 can be reduced by 1/(M*k+1) relative to a driver that employs a simple peaking inductor.

The transformer T1 also significantly reduces electromagnetic emissions relative to use of a simple inductor for peaking. Embodiments of the driver circuit 102 may vary the number of turns and/or the turns ratio of the transformer T1 to control the feedback current and/or the peaking parameters applied to the input drive stage 202.

Figure 3:
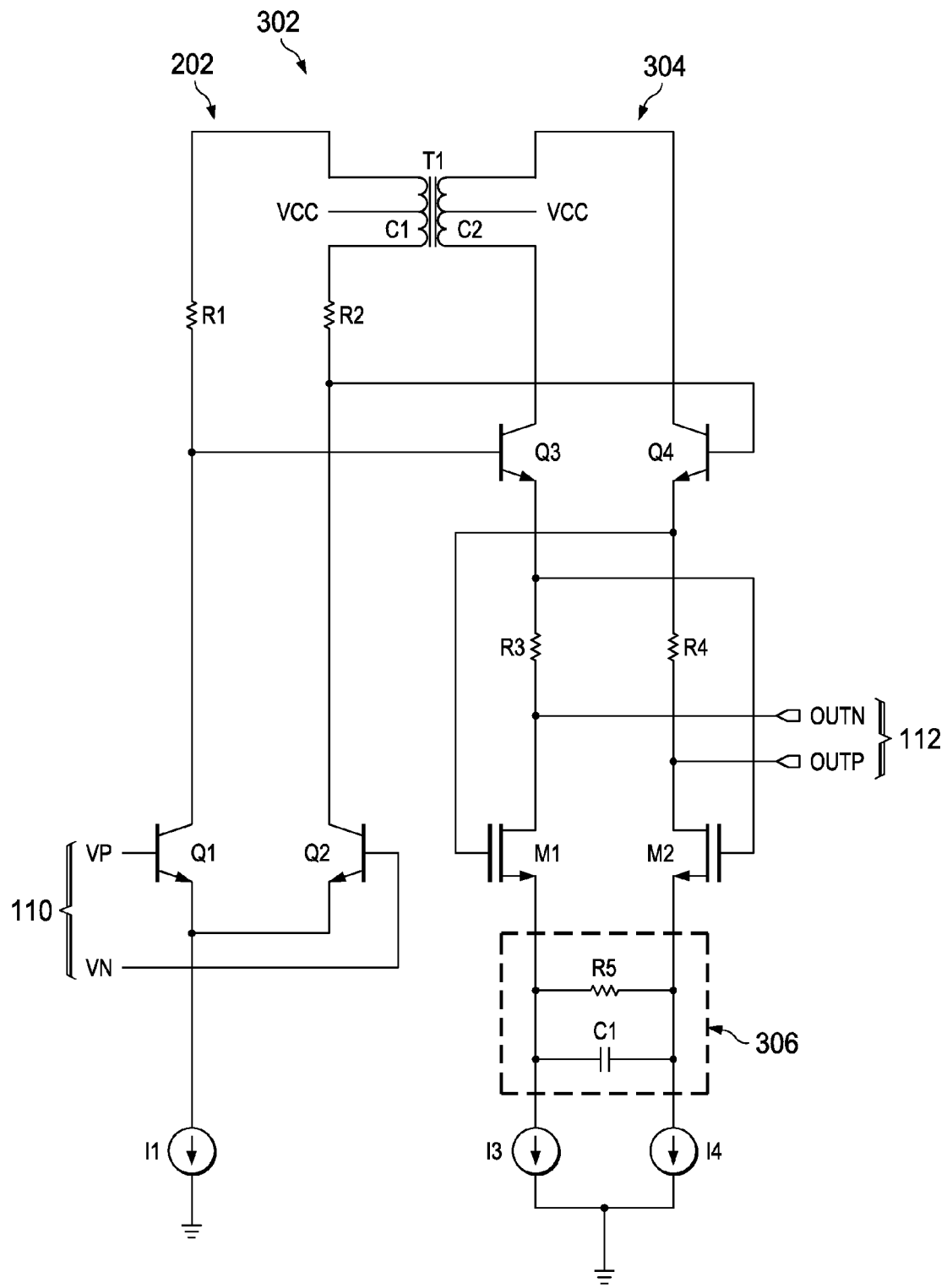
FIG. 3 shows a schematic diagram of a driver circuit in accordance with various embodiments.

The driver 102 can be modified in any number of ways while retaining the benefits of feedback through the transformer T1. FIG. 3 shows a schematic diagram of a driver circuit 302 in accordance with various embodiments. The driver circuit 302 is similar to the driver circuit 102. The driver circuit 302 includes an input drive stage 202 and an output drive stage 304. The input drive stage 202 drives the output drive stage 304. The input drive stage 202 includes transistors Q1 and Q2, resistors R1 and R2, and current source 11. The transistors Q1 and Q2 are connected and arranged to form a differential amplifier. The two phases of the differential input signal 110 drive the base terminals of the transistors Q1 and Q2. The emitter terminals of the transistors Q1 and Q2 are coupled to the current source 11.

Output of the input drive stage 202 is taken from the collectors of the transistors Q1 and Q2 and applied to the output drive stage 304. The output drive stage 204 includes transistors Q3 and Q4, resistors R3 and R4, field effect transistors (FETs) M1 and M2, and current source 12. The output of the transistors Q1 and Q2 is applied to the bases of transistors Q3 and Q4 as input to the output drive stage 204. The transistors Q3 and Q4 are arranged and connected as emitter followers. Output terminals OUTN and OUTP of the driver circuit 102 are provided at the emitters of the transistors Q3 and Q4. The transistors Q1, Q2, Q3, and Q4 may be NPN bipolar junction transistors.

The FETs M1 and M2 are coupled to the emitters of the transistors Q3 and Q4. More specifically, the drain terminals of the FETs M1 and M2 are respectively coupled to the emitters of the transistors Q3 and Q4 via resistors R3 and R4. The resistors R3 and R4 provide impedance matching for a load impedance (e.g., input impedance of the receiver circuit 106) driven by the driver circuit 102. The gate terminals of the FETs M1 and M2 are respectively connected to and driven by the emitters of the transistors Q4 and Q3. The source terminals of the FETs M1 and M2 are coupled to the current source 13 and 14 respectively. The FETs M1 and M2 may by N-channel FETs. In some embodiments, the FETs M1 and M2 may be replaced by a different type of transistor (e.g., a bipolar junction transistor).

The output drive stage 304 is coupled to the input drive stage 202 via the transformer T1. The transformer T1 includes windings or coils C1 and C2. The coil C1 may be the primary coil of the transformer T1, and the coil C2 may be the secondary coil of the transformer T1. Coil C2 electrically connects the collector terminals of the transistors Q3 and Q4 in the output drive stage 304. Coil C1 electrically connects the resistors R1 and R2 in the input drive stage 202.

Each of the coils C1 and C2 includes a center tap that is connected to a power supply voltage (e.g., Vcc) that powers the input drive stage 202 and the output drive stage 304.

The output drive stage 304 includes an RC impedance circuit 306 coupled to the drains of the FETs M1 and M2. The impedance circuit 306 includes a resistor R5 coupled to the drains of the FETs M1 and M2, and a capacitance C1 coupled in parallel with the resistor R5 to the drains of the FETs M1 and M2. In some implementations, the capacitance C1 and the resistor R5 are sized to wholly or at least partially cancel a parasitic capacitance of the circuit driven by the driver circuit 302. For instance, certain embodiments of the driver circuit 302 include a capacitance C1 which is of the same order of magnitude as the parasitic capacitance of the circuit driven by the driver circuit 302. Thus, due to the cross-coupling of the FETs M1 and M2 in the output drive stage 304, the impedance circuit 306 appears as a negative impedance looking into the output network from the output terminals of the output drive stage 304. Consequently, pad and routing capacitances CP can be at least partially cancelled by the impedance circuit 306 to thereby at least partially mitigate the limitations on the edge rate (rise time, fall time) of data being provided to receiver circuit 106. Moreover, the components R5 and C1 of the circuit 306 can be introduced into integrated circuit implementations of the driver circuit 302 at minimal cost, and without significant impact on power consumption of the driver circuit 302.

The driver circuit 102 can be modified in a variety of additional ways within the scope of the present disclosure. Such implementations may generally include a differential input amplifier in an input stage coupled to emitter followers of an output stage, and a feedback transformer providing current from the output stage to the input stage. For example, an implementation of the driver circuit 102 for driving signals within an integrated circuit may not include the FETs M1 and M2, but may include the input drive stage 202, emitter follower transistors Q3 and Q4, and the feedback transformer T1.

Figure 4:
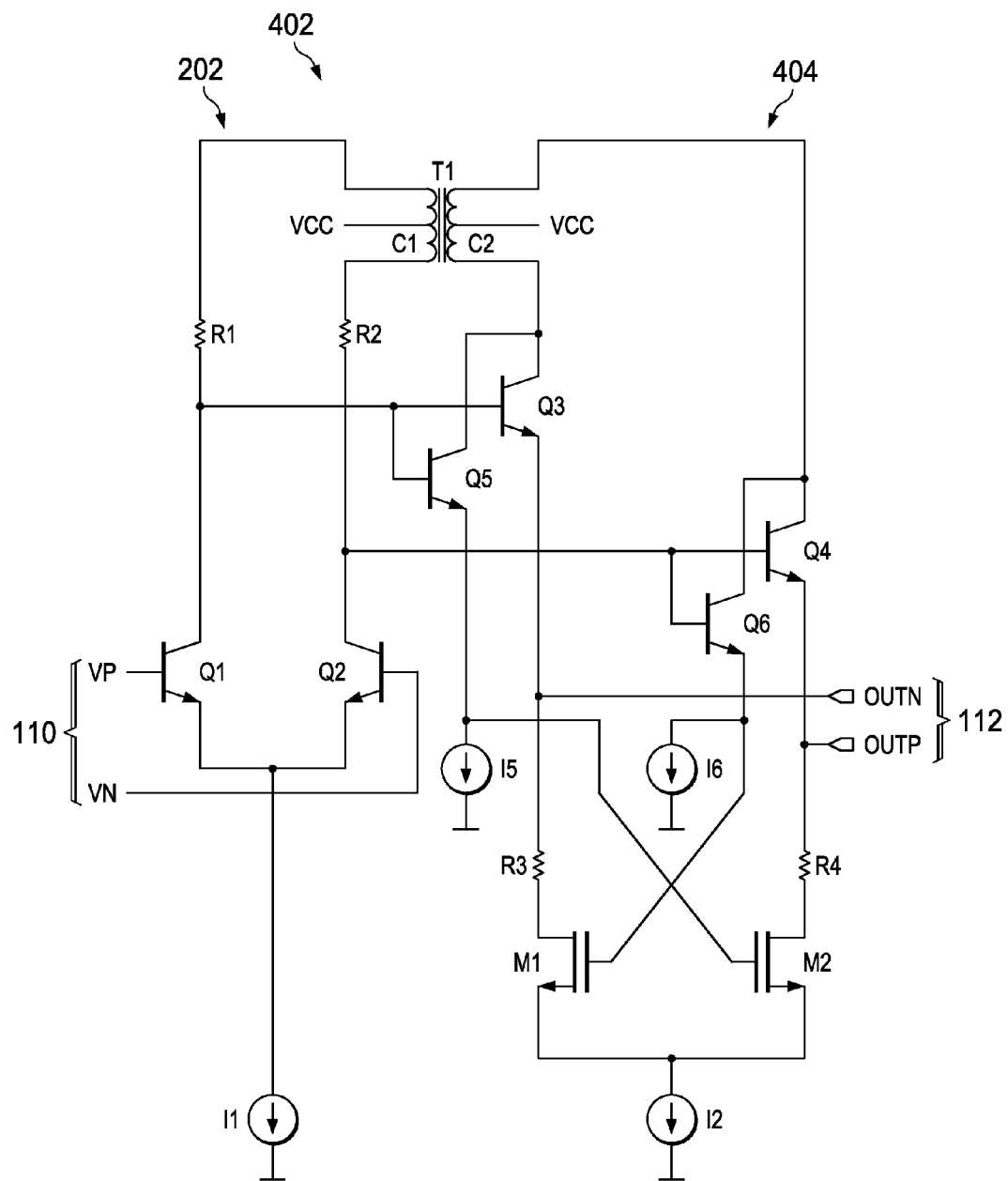
FIG. 4 shows a schematic diagram of a driver circuit in accordance with various embodiments.

FIG. 4 shows a schematic diagram of a driver circuit 402 in accordance with various embodiments. The driver 402 is similar to the driver 102, as shown in FIG. 1, but includes a modified output drive stage 404 that adds transistors Q5 and Q6 arranged as emitter followers to drive the MOSFETs M1 and M2. The transistor Q5 is generally parallel to the transistor Q3, and the transistor Q6 is generally parallel to the transistor Q4. The collector of transistor Q5 is coupled to coil C2 of transformer T1 and to the collector of transistor Q3. The base of transistor Q5 is coupled to the collector of transistor Q1 and to the base of transistor Q3. The emitter of transistor Q5 is coupled to the current source 15 and to the gate of MOSFET M2. MOSFET M2 is driven by the emitter of transistor Q5.

The collector of transistor Q6 is coupled to coil C2 of transformer T1 and to the collector of transistor Q4. The base of transistor Q6 is coupled to the collector of transistor Q2 and to the base of transistor Q4. The emitter of transistor Q6 is coupled to the current source 16 and to the gate of MOSFET M1. MOSFET M1 is driven by the emitter of transistor Q6. By using transistors Q5 and Q6 to drive the MOSFETs M1 and M2, rather than using transistors Q3 and Q4 to drive the MOSFETs M1 and M2, driver 402 may provide improved drive response (e.g., reduced capacitive loading) for the output signal 112.

The MOSFET drive transistors Q5 and Q6 may be implemented in various embodiments of a driver circuit. For example, the driver 302 shown in FIG. 3 may be modified to include the MOSFET drive transistors Q5 and Q6.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A driver circuit, comprising:
   an input drive stage configured to:
      receive a differential input signal; and
      amplify the differential input signal; and
   an output drive stage coupled to the input drive stage and configured to:
      receive amplified differential input signal from the input drive stage; and
      amplify the amplified differential input signal;
   a transformer configured to transfer current from the output drive stage to the input drive stage.

2. The driver circuit of claim 1, wherein the input drive stage comprises a current mode amplifier and the output drive stage comprises a voltage mode amplifier.

3. The driver circuit of claim 1, wherein the input drive stage comprises transistors arranged as a differential pair.

4. The driver circuit of claim 3, wherein the output drive stage comprises transistors coupled to the differential pair as emitter followers.

5. The driver circuit of claim 4, wherein a first coil of the transformer is electrically coupled to a collector terminal of each of the transistors of the differential pair, and a second coil of the transformer is electrically coupled to a collector terminal of each of the emitter followers.

6. The driver circuit of claim 5, wherein activation of the emitter followers initiates transfer of current from the output drive stage to the input drive stage.

7. The driver circuit of claim 4, wherein the output drive stage comprises:
   differential output terminals, one of the output terminals connected to an emitter terminal of each of the emitter followers; and
   field effect transistors (FETs), wherein a drain terminal of each of the FETs is coupled, via a resistor, to each of the output terminals.

8. The driver circuit of claim 1, wherein a first coil of the transformer is electrically coupled to the input drive stage, and a second coil of the transformer is electrically coupled to the output drive stage, and a power source is connected to a center tap of each of the first and second coil.

9. The driver circuit of claim 1, wherein the current transferred from the output drive stage to the input drive stage is a function of current in the input drive stage, a gain of the output drive stage, and a turns ratio of the transformer.

10. A driver circuit, comprising:
    transistors connected as a differential amplifier to receive a differential input signal;
    transistors connected to the differential amplifier as emitter followers; and
    a transformer configured to transfer current from collector terminals of the emitter followers to the differential amplifier, wherein a first coil of the transformer is connected to a collector terminal of each of the emitter followers, and a second coil of the transformer is coupled to a collector terminal of each of the transistors of the differential amplifier.

11. The driver circuit of claim 10, wherein a base terminal of each of the emitter followers is connected to a collector terminal of each of the transistors of the differential amplifier.

12. The driver circuit of claim 10, wherein activation of the emitter followers by signal at the collector terminals of the differential amplifier induces current flow in the second coil of the transformer.

13. The driver circuit of claim 12, wherein current flow induced in the second coil of the transformer is a function of current in the emitter followers and a turns ratio of the transformer.

14. The driver circuit of claim 10, wherein each of the first coil and second coil of the transformer comprises a center tap, and a power source is connected to each center tap.

15. The driver circuit of claim 10, further comprising:
    differential output terminals, each of the differential output terminals connected to an emitter terminal of one of the emitter followers;
    resistors, a first terminal of each of the resistors connected to one of the differential output terminals; and
    output transistors, a terminal of each of the output transistors connected to a second terminal of one of the resistors.

16. The driver circuit of claim 15, wherein a control terminal of each of the output transistors is connected to one of the differential output terminals.

17. A driver circuit, comprising:
    a differential predriver comprising transistors connected as a differential amplifier; and
    a driver comprising:
       transistors connected to the differential predriver as emitter followers, wherein a base terminal on each of the emitter followers is connected to a collector terminal of each of the transistors of the differential amplifier; and
       driver circuit output terminals connected to emitter terminals of the emitter followers; and
    a transformer connected to the differential predriver and the driver to provide positive feedback current from the driver to the predriver, wherein:
       a first coil of the transformer is connected to a collector terminal of each of the emitter followers, and a second coil of the transformer is coupled to a collector terminal of each of the transistors of the differential amplifier; and
       each of the first coil and second coil of the transformer comprises a center tap for connection of a power source to the predriver and the driver.

18. The driver circuit of claim 17, wherein activation of the emitter followers by signal at the collector terminals of the transistors of the differential amplifier induces flow of positive feedback current in the predriver.

19. The driver circuit of claim 18, wherein the positive feedback current induced in the predriver is a function of current in the emitter followers and a turns ratio of the transformer.

20. The driver circuit of claim 18, further comprising:
    resistors, a first terminal of each of the resistors connected to one of the driver circuit output terminals;
    metal oxide semiconductor field effect transistors (FETs), a drain terminal of each of the FETs connected to a second terminal of one of the resistors, and a gate terminal of each of the FETs connected to one of the driver circuit output terminals.

* * * * *